United States Patent
Wu et al.

(10) Patent No.: US 10,204,512 B2
(45) Date of Patent: Feb. 12, 2019

(54) METHOD AND SYSTEM FOR REALIZING REMOTE CONTROL BASED ON BLUETOOTH HUMAN INTERFACE DEVICE PROTOCOL

(71) Applicant: HuiZhou TCL Mobile Communication Co., Ltd., HuiZhou (CN)

(72) Inventors: Donghai Wu, HuiZhou (CN); Kaishu Li, HuiZhou (CN); Hanwu Xie, HuiZhou (CN)

(73) Assignee: HuiZhou TCL Mobile Communication Co., Ltd., HuiZhou (CN)

( * ) Notice: Subject to any disclaimer, the term of this patent is extended or adjusted under 35 U.S.C. 154(b) by 0 days.

(21) Appl. No.: 15/511,239

(22) PCT Filed: Jul. 6, 2016

(86) PCT No.: PCT/CN2016/088821
§ 371 (c)(1),
(2) Date: Mar. 15, 2017

(87) PCT Pub. No.: WO2017/080233
PCT Pub. Date: May 18, 2017

(65) Prior Publication Data
US 2017/0287324 A1    Oct. 5, 2017

(30) Foreign Application Priority Data

Nov. 13, 2015 (CN) .......................... 2015 1 0774305

(51) Int. Cl.
G08C 17/02 (2006.01)
G06F 3/023 (2006.01)
(Continued)

(52) U.S. Cl.
CPC ............. *G08C 17/02* (2013.01); *G06F 3/023* (2013.01); *G06F 13/102* (2013.01); *H04W 4/80* (2018.02);
(Continued)

(58) Field of Classification Search
CPC ............................... G08C 17/02; H04W 4/008
(Continued)

(56) References Cited

U.S. PATENT DOCUMENTS

| 7,783,702 B2 | 8/2010 | Liu et al. | |
| 2008/0226381 A1* | 9/2008 | Chiu | B43K 29/00 401/195 |

(Continued)

FOREIGN PATENT DOCUMENTS

| CN | 1975642 | 6/2007 |
| CN | 101192333 | 6/2008 |

(Continued)

*Primary Examiner* — Vernal U Brown

(57) ABSTRACT

A method for realizing the remote control based on the Bluetooth HID protocol includes connecting a manipulation device with a remote device by a BLUETOOTH; mapping, by the manipulation device, control keys into a HID command by using the Bluetooth HID protocol and sends the HID command to the remote device, if the manipulation device receives an operation that a user presses the control keys during the remote device executes a functional software; and translating, by the remote device, the HID command to a logic key and executing the logic key to realize the remote control after the remote device receives the HID command.

12 Claims, 1 Drawing Sheet

(51) Int. Cl.
    *H04W 4/80*      (2018.01)
    *G06F 13/10*     (2006.01)
    *H03M 11/00*     (2006.01)

(52) U.S. Cl.
    CPC ..... *G08C 2201/20* (2013.01); *G08C 2201/30* (2013.01); *H03M 11/00* (2013.01)

(58) Field of Classification Search
    USPC .......................................................... 340/4.3
    See application file for complete search history.

(56) References Cited

U.S. PATENT DOCUMENTS

2008/0266763 A1* 10/2008 Tanaka ................ H04M 1/0279
                                                    361/724
2012/0200400 A1*  8/2012 Arling .................... G08C 19/28
                                                    340/12.28

FOREIGN PATENT DOCUMENTS

| CN | 101409743 | 4/2009  |
| CN | 102819392 | 12/2012 |
| CN | 105425990 | 3/2016  |

\* cited by examiner

METHOD AND SYSTEM FOR REALIZING REMOTE CONTROL BASED ON BLUETOOTH HUMAN INTERFACE DEVICE PROTOCOL

RELATED APPLICATIONS

This application is a National Phase of PCT Patent Application No. PCT/CN2016/088821 having International filing date of Jul. 6, 2016, which claims the benefit of priority of Chinese Patent Application No. 201510774305.2 filed on Nov. 13, 2015. The contents of the above applications are all incorporated by reference as if fully set forth herein in their entirety.

FIELD AND BACKGROUND OF THE INVENTION

The present disclosure relates to application field of BLUETOOTH, and more particularly, to a method and a system for realizing a remote control based on a Bluetooth human interface device (HID) protocol.

Since mobile internet develops rapidly, portable equipments such as mobile phones have been popular, where types of the portable equipment are increasing, and market competition has become increasingly fierce. Improving function of the portable equipment becomes a general trend. At present, many companies and functional departments all can use software at a meeting, such as POWERPOINT (PPT), and a user has to press a corresponding key (such as a directional key) of a computer to control the PPT, which inconveniences operation of the user.

Therefore, the prior art needs to be improved and developed.

SUMMARY OF THE INVENTION

Based on deficiency of the prior art, the aim of the present disclosure is to provide a method and a system for realizing a remote control based on a Bluetooth human interface device (HID) protocol capable of solving an issue that operation of a functional software of the prior art is inconvenient.

The technical scheme of the present disclosure is as follow:

A system for realizing a remote control based on a Bluetooth human interface device (HID) protocol comprising: a manipulation device and a remote device, where the manipulation device is connected with the remote device by a Bluetooth.

The manipulation device maps a control key into a HID command by using the Bluetooth HID protocol and sends the HID command to the remote device, if the manipulation device receives an operation that a user presses the control key during the remote device executes a functional software.

The remote device translates the HID command to a logic key and performs the logic key to remotely control after the remote device receives the HID command.

The manipulation device starts a timer when the user presses a middle key, transmits an HID command corresponding to the middle key at predetermined timing intervals to execute an automatic playing, and stops the timer to cancel the automatic playing during executing the automatic playing, if the user presses any one of control keys.

In the system for realizing the remote control based on the Bluetooth HID protocol, the functional software is POWERPOINT (PPT).

A method for realizing a remote control based on a Bluetooth human interface device (HID) protocol comprises:
  A: connecting a manipulation device with a remote device by Bluetooth;
  B: mapping, by the manipulation device, a control key into a HID command by using the Bluetooth HID protocol and sends the HID command to the remote device, if the manipulation device receives an operation that a user presses the control key during the remote device executes a functional software; and
  C: translating, by the remote device, the HID command to a logic key and executing the logic key to realize the remote control after the remote device receives the HID command.

In the method for realizing the remote control based on the Bluetooth HID protocol, the functional software is POWERPOINT (PPT).

In the method for realizing the remote control based on the Bluetooth HID protocol, the control key comprises an up key, a down key, a left key, a right key and a middle key.

In the method for realizing the remote control based on the Bluetooth HID protocol, in the step B, starting a timer when the user press the middle key; transmitting an HID command corresponding to the middle key at predetermined timing intervals to execute the automatic playing.

In the method for realizing the remote control based on the Bluetooth HID protocol, stopping the timer to cancel the automatic playing during executing the automatic playing, if the user presses any one of control keys.

A system for realizing a remote control based on a Bluetooth human interface device (HID) protocol comprising: a manipulation device and a remote device, where the manipulation device is connected with the remote device by Bluetooth.

The manipulation device maps a control key into a HID command by using the Bluetooth HID protocol and sends the HID command to the remote device if the manipulation device receives an operation that a user presses the control key during the remote device executes the functional software.

The remote device translates the HID command to a logic key and executes the logic key to remotely control after the remote device receives the HID command.

In the system for realizing the remote control based on the Bluetooth HID protocol, the functional software is POWERPOINT (PPT).

In the system for realizing the remote control based on the Bluetooth HID protocol, the control key comprises an up key, a down key, a left key, a right key and a middle key.

In the system for realizing the remote control based on the Bluetooth HID protocol, the manipulation device starts a timer when the user press the middle key, transmits an HID command corresponding to the middle key at predetermined timing intervals to execute an automatically playing.

In the system for realizing the remote control based on the Bluetooth HID protocol, the manipulation device stops the timer to cancel the automatic playing during executing the automatic playing, if the user presses any one of control keys.

Beneficial effect: the present disclosure uses the Bluetooth HID protocol to realize that the manipulation device (portable device) remotely controls the functional software of the remote device, which makes controlling processing more convenience without pressing the key of the remote device, further having more practicability.

DESCRIPTION OF SPECIFIC EMBODIMENTS OF THE INVENTIONS

The present disclosure provides a method and a system for realizing a remote control based on a Bluetooth human interface device (HID) protocol. In order to more clearly illustrate aim, the technical scheme and effects of the present disclosure, the present disclosure will further be described in detail. It should be understood that the present disclosure has been described with reference to certain preferred and alternative embodiments which are intended to be exemplary only and do not limit the full scope of the present disclosure.

Figure 1:
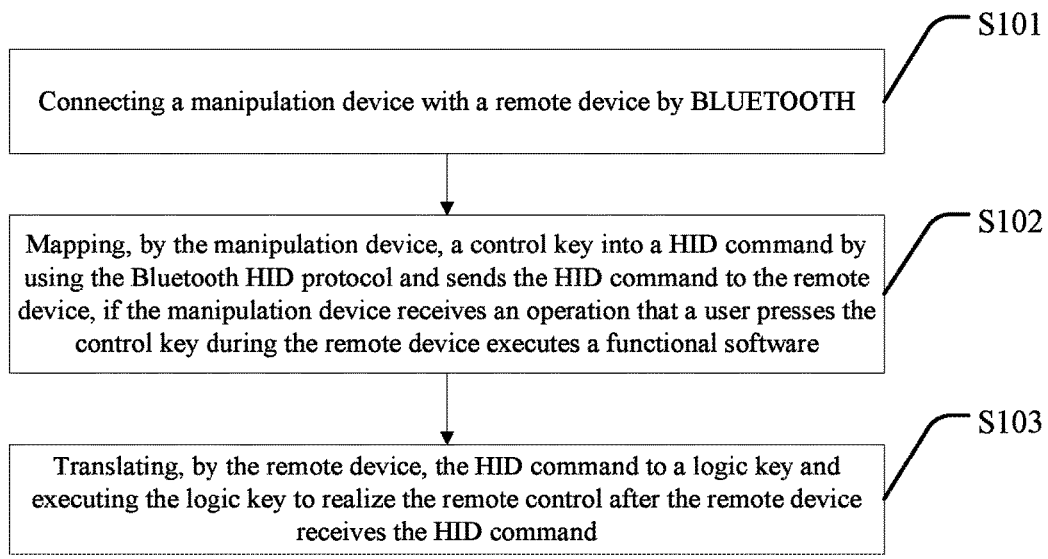
FIG. 1 is a flowchart of a method for realizing a remote control based on a Bluetooth human interface device (HID) protocol of a preferred embodiment of the present disclosure.

As shown in FIG. 1, FIG. 1 is a flowchart of a method for realizing a remote control based on a Bluetooth human interface device (HID) protocol of a preferred embodiment of the present disclosure, where the method for realizing the remote control based on the Bluetooth HID protocol comprises steps:

Step(S) 101: connecting a manipulation device with a remote device by BLUETOOTH;

Step(S) 102: mapping, by the manipulation device, a control key into a HID command by using the Bluetooth HID protocol and sends the HID command to the remote device, if the manipulation device receives an operation that a user presses the control key during the remote device executes a functional software;

Step(S) 103: translating, by the remote device, the HID command to a logic key and executing the logic key to realize the remote control after the remote device receives the HID command.

In the step 101, the manipulation device (controlling party) is connected with the remote device (controlled party) by the BLUETOOTH (namely setting HID connection). In setting the HID connection, a connection process of the present disclosure comprises: the manipulation device is actively connected with the remote device, or the manipulation device is passively waiting to be connected with the remote device, thus, the present disclosure can automatically initiate request of the HID connection from the remote device, and also can response to the request of the HID connection from the remote device.

The manipulation device of the present disclosure can be portable electronic equipment, such as mobile phones and tablet computers, which makes the function of the present disclosure be one application of the portable electronic equipments, further using the application to remotely control functional software of the remote device. Or, the manipulation device can be an additional portable equipment having a BLUETOOTH function, and the additional portable equipment can be designed as a small and portable structure to conveniently control and carry.

Furthermore, the functional software is POWERPOINT (PPT), players of some mainstream PPT supports the Bluetooth HID protocol. For example, widely used MICROSOFT PPT supports the Bluetooth HID protocol. Thus, the function of the present disclosure can be widely used and have high practicability.

Generally speaking, when the user uses the PPT, the most used function is "page up" and "page down". On the computer, the user can use a PgUp key, a PgDn key, an up directional key, a down directional key, a left directional key, and a right directional key to control the PPT to play. The number of the control keys of the present disclosure has five as follow: an up key, a down key, a left key, a right key and a middle key, where the middle key is used to remotely control the PPT of the remote device to automatically play. The up key, the down key, the left key and the right key are used to remotely control the PPT of the remote device to turn page. For example, the up key and the left key can turn page up, and the down key and the right key can turn page down.

When the user presses any control keys of the up key, the down key, the left key, the right key and the middle key, the Bluetooth HID protocol makes the control keys map the HID command, and the HID command is sent to the remote device by the BLUETOOTH. The remote device uses the Bluetooth HID protocol to translate the HID command to the logic key, and the logic key is executed, which remotely controls the PPT. For example, the user presses the up key, and the up key is mapped to a corresponding HID command: PgUp, and the HID command is transmitted to the remote device by the BLUETOOTH. The remote device receives the HID command and translate the HID command to the logic key (PgUp), and the logic key (PgUp) is executed to turn page up. In short, the user presses the up key on the control interface of the manipulation device (the control interface also can be not set, and the control keys are directly set to an entity key). Pressing the up key of the control interface is corresponded to press the logic key (PgUp) to remotely control the PPT to play.

In the present disclosure, a mapping relation between the control keys and the remote device is shown as follow:

the up key—⟩PgUp of the remote device
the down key—⟩PgDn of the remote device
the left key—⟩left directional key of the remote device
the right key—⟩right directional key of the remote device.

In practical using, the map relation is amended referring to a Bluetooth HID specification and according to specific requirements.

In order to conveniently use, the present disclosure comprises a function to remotely control the PPT of the remote device to execute automatic playing. Namely, the manipulation device starts a timer when the user presses the middle key, transmits the HID command corresponding to the middle key at predetermined timing intervals to execute an automatic playing. The HID command corresponding to the middle key is also used to turn page down. To be specific, when the user presses the middle key, the manipulation device transmits one HID command (PgDn) to the remote device to turn page down for the PPT of the remote device. At the same time, the manipulation device starts the timer, and transmits the HID command corresponding to the middle key to the remote device at predetermined timing intervals to execute automatic playing. The timing interval is adjusted according to requirement.

The manipulation device stops the timer when the user presses any control keys, and cancels the automatic playing.

Preferably, the manipulation device stops the timer when the user presses the middle key, and cancels the automatic playing.

Operation steps of the present disclosure is shown as follow:

1. one operation step for actively connecting
   1) starting BLUETOOTH of the manipulation device;
   2) searching and matching with the remote device;
   3) initiating request of the HID connection by the manipulation device; if the manipulation device is connected with the remote device, entering the 4), if the manipulation device is not connected with the remote device, continuing to connect;
   4) entering the control interface;
   5) pressing one of the up key, down key, left key, right key and the middle key;
   6) sending the corresponding the HID command to the remote device; determining whether the control interface quits or not, if the control interface does not quit, returning 5); if the control interface quits, returning 7)
   7) quitting.
2. one operation step for passively connecting
   1) monitoring whether request of the HID connection is from the remote device or not;
   2) accepting the request of the HID connection from the remote device, if the manipulation device is connected with the remote device, entering 3), if the manipulation device is not connected with the remote device, continuing to connect;
   3) entering the control interface;
   4) pressing one of the up key, the down key, the left key, the right key and the middle key;
   5) sending the corresponding HID command to the remote device; determining whether the control interface quits or not, if the control interface does not quit, returning 4); if the control interface quits, returning 6);
   6) quitting.

Based on the above method, the present disclosure provides a system for realizing the remote control based on a Bluetooth human interface device (HID) protocol, where the system comprises the manipulation device and the remote device, where the manipulation device is connected with the remote device by the BLUETOOTH.

The manipulation device maps the control key into the HID command by using the Bluetooth HID protocol and sends the HID command to the remote device, if the manipulation device receives the operation that the user presses the control key during the remote device executes a functional software.

The remote device translates the HID command to a logic key and executes the logic key to remotely control after the remote device receives the HID command.

Figure 2:
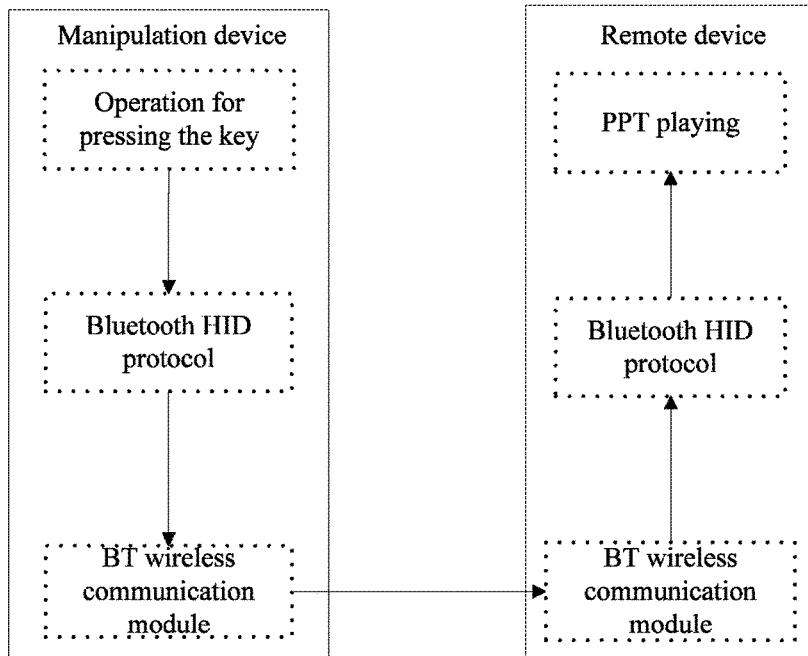
FIG. 2 is a flow graph of signals of a method for realizing the remote control based on the Bluetooth HID protocol of the present disclosure.

A flow graph of signals of the manipulation device and the remote device of the present disclosure is shown in FIG. 2. The user presses the key on the manipulation device, the Bluetooth HID protocol is used to make the control keys map the HID command, the manipulation device and the remote device transmits information by Bluetooth (BT) wireless communication module, and the remote device translates the HID command to the logic key by the Bluetooth HID protocol to control the PPT to play.

Furthermore, the functional software is PPT.

Furthermore, the control keys comprise the up key, the down key, the left key, and the middle key.

Furthermore, the manipulation device starts the timer when the user presses the middle key, transmits the HID command corresponding to the middle key at predetermined timing intervals to execute the automatic playing.

Furthermore, the manipulation device starts the timer when the user press the middle key, transmits an HID command corresponding to the middle key at predetermined timing intervals to execute an automatically playing.

Technical details have been described in detail as the above embodiment of the above device. Thus, it will not be described.

As the above, the present disclosure uses the Bluetooth HID protocol to realize that the manipulation device (portable device) remotely controls the functional software of the remote device, which makes controlling processing more convenience without pressing the key of the remote device, further having more practicality.

It should be understood that present disclosure is not limited to the exemplary examples. Person skilled in the art should understand and achieve that equivalent replacement and improvement is according to the above description. The equivalent replacements and improvements should be considered to belong to the protection scope of the present disclosure.

What is claimed is:

1. A system for realizing a remote control based on a BLUETOOTH human interface device (HID) protocol comprising:
   a manipulation device and a remote device;
   wherein the manipulation device is connected with the remote device by BLUETOOTH, wherein the manipulation device connects with the remote device by BLUETOOTH by a process comprising:
   searching for the remote device and matching the manipulation device with the remote device using BLUETOOTH;
   initiating request of an HID connection by the manipulation device; if the manipulation device is connected with the remote device, entering a control interface of the manipulation device; if the manipulation device is not connected with the remote device, continuing to connect the manipulation device with the remote device;
   pressing a control key of the manipulation device; and
   sending a corresponding HID command to the remote device; determining whether the control interface quits or not; if the control interface does not quit, returning the step for pressing the control key; if the control interface quits, ending the connection between the remote device and the manipulation device;
   wherein the manipulation device maps the control key into a HID command by using the BLUETOOTH HID protocol and sends the HID command to the remote device, if the manipulation device receives an operation that the control key is pressed during the remote device executes a functional software;
   wherein the remote device translates the HID command to a logic key and executes the logic key to remotely control after the remote device receives the HID command;
   wherein the manipulation device starts a timer when a middle key is pressed, transmits an HID command corresponding to the middle key at predetermined timing intervals to execute an automatic playing; and stops the timer to cancel the automatic playing during executing the automatic playing, if the control key is pressed.

2. The system for realizing the remote control based on the BLUETOOTH HID protocol as claimed in claim 1, wherein the functional software is POWERPOINT (PPT).

3. A method for realizing a remote control based on a BLUETOOTH human interface device (HID) protocol comprising:
A: connecting a manipulation device with a remote device by BLUETOOTH, wherein the manipulation device connects with the remote device by BLUETOOTH by a process comprising:
searching for the remote device and matching the manipulation device with the remote device using BLUETOOTH;
initiating request of a HID connection by the manipulation device; if the manipulation device is connected with the remote device, entering a control interface of the manipulation device; if the manipulation device is not connected with the remote device, continuing to connect the manipulation device with the remote device;
pressing a control key of the manipulation device; and
sending a corresponding HID command to the remote device; determining whether the control interface quits or not; if the control interface does not quit, returning the step for pressing the control key; if the control interface quits, ending the connection between the remote device and the manipulation device;
B: mapping, by the manipulation device, the control key into a HID command by using the BLUETOOTH HID protocol and sends the HID command to the remote device, if the manipulation device receives an operation that the control key is pressed during the remote device executes a functional software; and
C: translating, by the remote device, the HID command to a logic key and executing the logic key to realize the remote control after the remote device receives the HID command.

4. The method for realizing the remote control based on the BLUETOOTH HID protocol as claimed in claim 3, wherein the functional software is POWERPOINT (PPT).

5. The method for realizing the remote control based on the BLUETOOTH HID protocol as claimed in claim 4, wherein the control key comprises an up key, a down key, a left key, a right key and a middle key.

6. The method for realizing the remote control based on the BLUETOOTH HID protocol as claimed in claim 5, wherein the step B comprises starting a timer when the middle key is pressed; and transmitting an HID command corresponding to the middle key at predetermined timing intervals to execute automatic playing.

7. The method for realizing the remote control based on the BLUETOOTH HID protocol as claimed in claim 6, wherein the timer is stopped to cancel the automatic playing during executing the automatic playing, if the control key is pressed.

8. A system for realizing a remote control based on a BLUETOOTH human interface device (HID) protocol comprising: a manipulation device and a remote device; wherein the manipulation device is connected with the remote device by BLUETOOTH, wherein the manipulation device connects with the remote device by BLUETOOTH by a process comprising:
searching for the remote device and matching the manipulation device with the remote device using BLUETOOTH;
initiating request of a HID connection by the manipulation device; if the manipulation device is connected with the remote device, entering a control interface of the manipulation device; if the manipulation device is not connected with the remote device, continuing to connect the manipulation device with the remote device;
pressing a control key of the manipulation device; and
sending a corresponding HID command to the remote device; determining whether the control interface quits or not; if the control interface does not quit, returning the step for pressing the control key; if the control interface quits, ending the connection between the remote device and the manipulation device;
wherein the manipulation device maps the control key into a HID command by using the BLUETOOTH HID protocol and sends the HID command to the remote device, if the manipulation device receives an operation that the control key is pressed during the remote device executes a functional software;
wherein the remote device translates the HID command to a logic key and executes the logic key to remotely control after the remote device receives the HID command.

9. The system for realizing the remote control based on the BLUETOOTH HID protocol as claimed in claim 8, wherein the functional software is POWERPOINT (PPT).

10. The system for realizing the remote control based on the BLUETOOTH HID protocol as claimed in claim 9, wherein the control key comprises an up key, a down key, a left key, a right key and a middle key.

11. The system for realizing the remote control based on the BLUETOOTH HID protocol as claimed in claim 10, wherein the manipulation device starts a timer when the middle key is pressed, transmits an HID command corresponding to the middle key at predetermined timing intervals to execute an automatically playing.

12. The system for realizing the remote control based on the BLUETOOTH HID protocol as claimed in claim 11, wherein the manipulation device stops the timer to cancel the automatic playing during executing the automatic playing, if the control key is pressed.

* * * * *